(12) United States Patent
Azadet et al.

(10) Patent No.: US 7,868,801 B2
(45) Date of Patent: Jan. 11, 2011

(54) METHODS AND APPARATUS FOR LOOK-AHEAD BLOCK PROCESSING IN PREDICTIVE DELTA-SIGMA MODULATORS

(75) Inventors: Kameran Azadet, Morganville, NJ (US); Samer Hijazi, Bethlehem, PA (US); Joseph H. Othmer, Ocean, NJ (US)

(73) Assignee: LSI Corporation, Milpitas, CA (US)

( * ) Notice: Subject to any disclaimer, the term of this patent is extended or adjusted under 35 U.S.C. 154(b) by 105 days.

(21) Appl. No.: 12/415,003

(22) Filed: Mar. 31, 2009

(65) Prior Publication Data

US 2010/0245137 A1 Sep. 30, 2010

(51) Int. Cl.
*H03M 3/02* (2006.01)
(52) U.S. Cl. .................................. 341/143; 341/76
(58) Field of Classification Search .................. 341/76, 341/77, 143
See application file for complete search history.

(56) References Cited

U.S. PATENT DOCUMENTS

| | | | |
|---|---|---|---|
| 6,115,726 A * | 9/2000 | Ignjatovic | 708/300 |
| 6,232,899 B1 * | 5/2001 | Craven | 341/126 |
| 6,600,788 B1 * | 7/2003 | Dick et al. | 375/245 |
| 2005/0162285 A1 * | 7/2005 | Melanson | 341/50 |
| 2005/0162286 A1 * | 7/2005 | Melanson | 341/50 |

* cited by examiner

*Primary Examiner*—Howard Williams
(74) *Attorney, Agent, or Firm*—Ryan, Mason & Lewis, LLP

(57) ABSTRACT

Methods and apparatus are provided for look-ahead block processing in predictive delta-sigma modulators. An input signal is quantized using a predictive delta-sigma modulator by generating error prediction values for a current block of input values based on a linear combination of error prediction values from one or more previous blocks, input values of one or more previous blocks, quantized values of one or more previous blocks and the current block of input values; computing speculative error prediction values for at least one input value in the current block, wherein the speculative error prediction values are computed for a plurality of possible quantizer output values; selecting one of the speculative error prediction values based on a quantized value from the current block; and subtracting the error prediction values for the current block from the corresponding current block of input values.

18 Claims, 4 Drawing Sheets

METHODS AND APPARATUS FOR LOOK-AHEAD BLOCK PROCESSING IN PREDICTIVE DELTA-SIGMA MODULATORS

FIELD OF THE INVENTION

The present invention is related to delta-sigma modulators and, more particularly, to delta-sigma modulators with improved processing speeds.

BACKGROUND OF THE INVENTION

Delta-sigma ($\Delta$-$\Sigma$) modulators, sometimes referred to as sigma-delta ($\Sigma$-$\Delta$) modulators, encode higher resolution signals into lower resolution signals. Delta-sigma modulators have found increasing use in a range of modern electronic components, such as digital-to-analog converters (DACs), analog-to-digital converters (ADCs) and frequency synthesizers. For example, delta-sigma modulators have been proposed or suggested for directly synthesizing RF signals from information carrying digital base band signals. Implementing such delta-sigma modulators, however, at the sampling rates required by emerging wireless communications standards, such as 2 GHz, has proven to be a significant challenge. It has been suggested that when the sampling rate of a delta-sigma modulator exceeds rates of 400-800 MHz, it may become challenging to implement the delta-sigma modulator using existing CMOS technology (e.g., 45 nm process).

A need therefore exists for improved delta-sigma modulators that can operate at increasing speeds. A further need exists for improved delta-sigma modulators that employ look-ahead block processing.

SUMMARY OF THE INVENTION

Generally, methods and apparatus are provided for look-ahead block processing in predictive delta-sigma modulators. According to one aspect of the invention, an input signal is quantized using a predictive delta-sigma modulator by generating error prediction values for a current block of input values based on a linear combination of error prediction values from one or more previous blocks, input values of one or more previous blocks, quantized values of one or more previous blocks and the current block of input values; computing speculative error prediction values for at least one input value in the current block, wherein the speculative error prediction values are computed for a plurality of possible quantizer output values; selecting one of the speculative error prediction values based on a quantized value from the current block; and subtracting the error prediction values for the current block from the corresponding current block of input values. Generally, the input signal has a rate of $F_{clk}$ and the steps of generating, computing, selecting and subtracting operate at a rate of $F_{clk}/J$.

In one exemplary embodiment, the subtracting step further comprises the computation of $q(n+j)=Q(r(n+j)-e_1(n+j))$. The linear combination can be expressed as follows:

$$e_1(n+j) = \sum_{k=1}^{N} \alpha_{k,j} e_1(n-k) + \sum_{k=1}^{N} \beta_{k,j} q(n-k) +$$

$$\sum_{k=1}^{j} \gamma_{k,j} q(n+j-k) - \sum_{k=1}^{N} \delta_{k,j} r(n-k) - \sum_{k=1}^{N} b_k r(n+j-k)$$

wherein $\alpha$, $\beta$, $\gamma$ and $\delta$ are precomputed coefficient values based on coefficients a and b, where a and b are coefficients of an error predictive filter.

A more complete understanding of the present invention, as well as further features and advantages of the present invention, will be obtained by reference to the following detailed description and drawings.

DETAILED DESCRIPTION

The present invention provides improved delta-sigma modulators that can operate at increasing speeds. According to one aspect of the invention, delta-sigma modulators are provided that employ look-ahead block processing.

Figure 1:
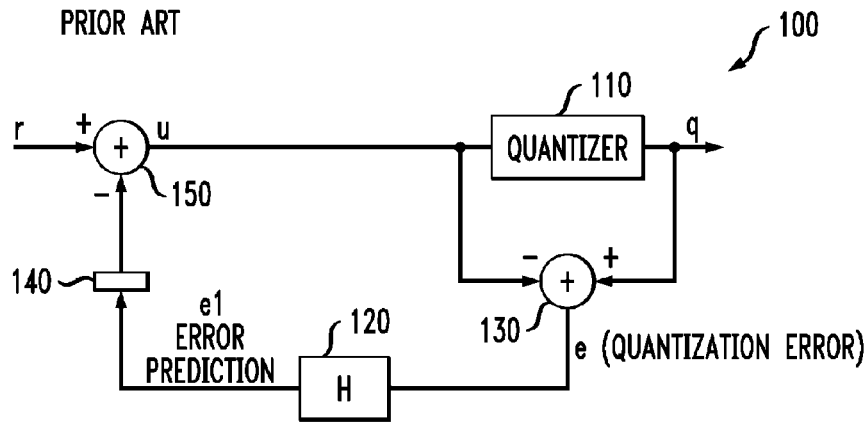
FIG. 1 illustrates an exemplary conventional delta-sigma modulator.

FIG. 1 illustrates an exemplary conventional delta-sigma modulator 100. As shown in FIG. 1, the exemplary delta-sigma modulator 100 employs a quantizer 110, such as a one bit quantizer, and an error predictive filter 120. The input value, u, to the quantizer 110 is compared to the quantized output value, q, by an adder 130 that generates a quantization error, e. The quantization error, e, is processed by the error predictive filter 120 to generate an error prediction value, e1, that is stored in a register 140 for one clock cycle and then subtracted from the input signal, r, by an adder 150 that generates the error-compensated input value, u. Generally, error predictive filters 120 employ some knowledge of the input signal to filter the signal, in a known manner. For example, if the error is known to be slowly varying, the error predictive filter 120 can use the same value for subsequent samples.

Generally, for a one bit quantizer 110, the quantized output provides a coarse approximation of the input signal. The input signal, r, may be, for example, a 16 bit digital value, and the one bit quantization performed by the quantizer 110 (e.g., the quantization can be based on the polarity of the input signal) provides a coarse analog conversion. The quantization noise, e, associated with the one bit quantizer 110 is primarily out-of-band. As previously indicated, the one bit quantization performed by the exemplary quantizer 110 is inherently linear.

The present invention recognizes that when the sampling rate of a delta-sigma modulator exceeds rates of 400-800 MHz, it may become challenging to implement the delta-sigma modulator 200 using existing CMOS technology (e.g., 45 nm process). In order to permit an implementation of the delta-sigma modulator 100 at arbitrarily high sampling frequencies, potentially as high as 8 GS/s or more, an aspect of the present invention provides an implementation that employs parallel processing. The disclosed parallel processing techniques overcome the challenges of parallelizing the non-linear feedback loop in the delta-sigma modulator 100. Generally, in a non-linear loop, computation of a current output value requires knowledge of a previous output which is not yet available.

According to another aspect of the invention, several consecutive output bits are computed in parallel (as a block) using a block of input data using look-ahead/speculative computation. The disclosed look-ahead computation techniques solve the problem of un-rolling the non-linear loop in order to perform parallel/block processing. As previously indicated, computing a current output value requires knowledge of a previous value, which is not readily available. Generally, the present invention recognizes that although the previous output values may not be available when a block of values is computed in parallel, the output values may only take a few discrete values as they correspond to the output of a quantizer. For example, the output of the exemplary one bit delta-sigma modulator 100 only takes two possible values (+1 or −1). Thus, the current outputs can be computed for all possible cases of previous output values, and once the previous output samples are available, the correct result can be selected.

Figure 2A:
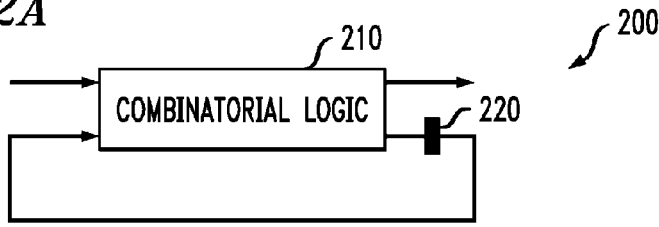
FIG. 2A illustrates a sequential logic circuit.
Figure 2B:
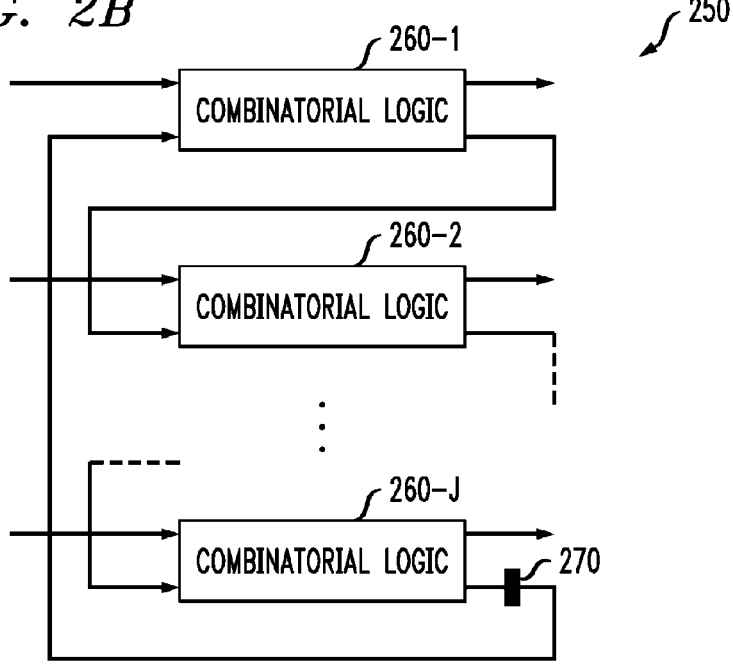
FIG. 2B illustrates an exemplary block processing technique for the sequential logic circuit of FIG. 2A.

FIG. 2A illustrates a sequential logic circuit 200, where at least one output of the combinatorial logic circuit 210 is delayed by a delay stage 220 and used as an input. The sequential logic circuit 200 is generally clocked at a rate of $F_{clk}$. FIG. 2B illustrates an exemplary block processing technique 250 for the sequential logic circuit 200 of FIG. 2A. As shown in FIG. 2B, a block processing implementation 250 employs J combinatorial logic circuits 260-1 through 260-J, each clocked at a slower rate of $F_{clk}/J$.

As previously indicated, the disclosed parallel processing techniques recognize that the exemplary delta-sigma modulator 100 has a linear path that comprises the input to the quantizer 110 being applied to the adder 130 and a non-linear path that comprises the output of the quantizer 110 being fed back to the adder 130. In order to address the non-linear path, an unrolling technique is employed to parallelize the non-linear feedback loop in the delta-sigma modulator 100.

Figure 3:
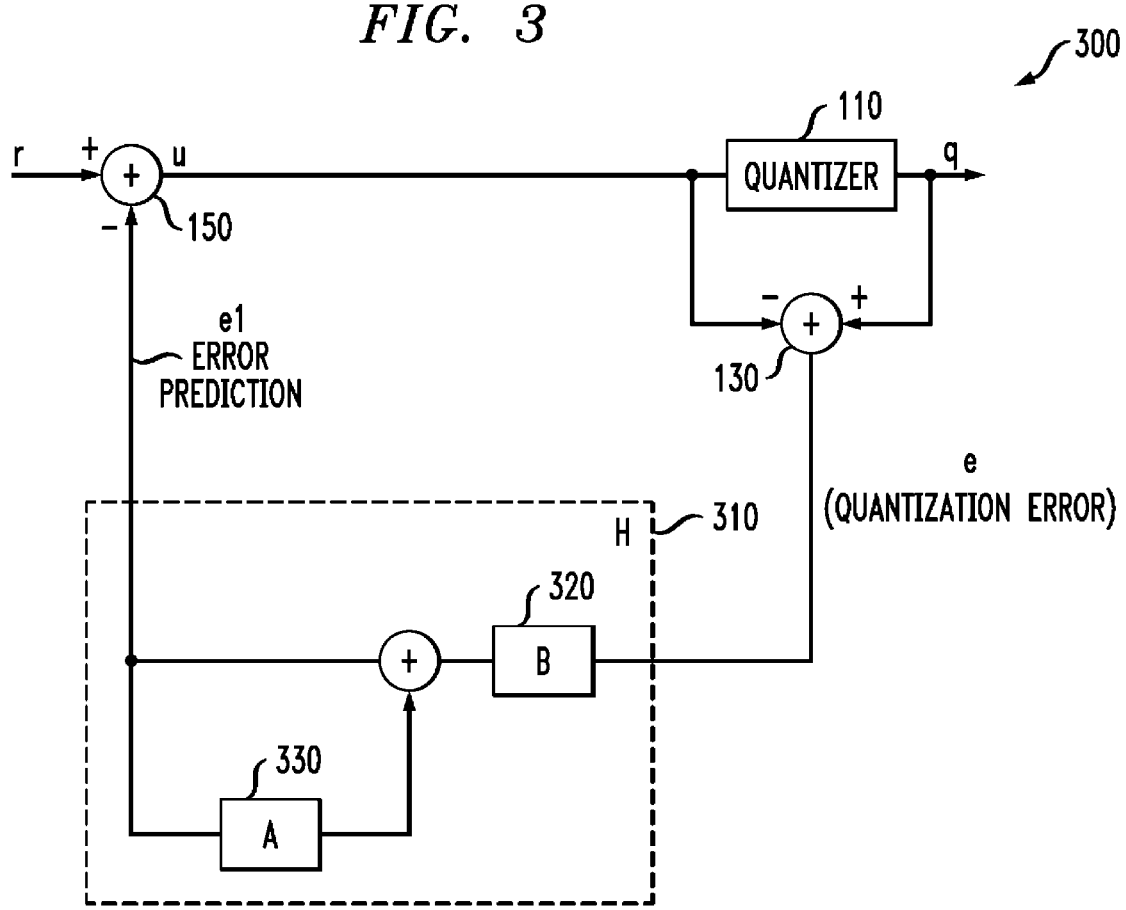
FIG. 3 illustrates an exemplary signal flow for a delta-sigma modulator that employs look-ahead/block processing techniques in accordance with an embodiment of the present invention.

FIG. 3 illustrates an exemplary signal flow for a delta-sigma modulator 300 that employs look-ahead/block processing techniques in accordance with an embodiment of the present invention. As shown in FIG. 3, the exemplary delta-sigma modulator 300 employs a quantizer 110 and an error predictive filter 310, in a similar manner to the embodiment of FIG. 1. The input value to the quantizer 110 is compared to the output value, q, by an adder 130 that generates a quantization error, e. The quantization error, e, is processed by the error predictive filter 310 to generate an error prediction value, e1, that is subtracted from the input signal, r, by the adder 150 that generates the error-compensated input value, u. It is noted that the error predictive filter 310 may contain one or more registers.

As shown in FIG. 3, the exemplary error predictive filter 310 comprises a first block 320 to represent the numerator, B, of the filter response expression, H, and a second block 330 to represent the denominator, A, of the filter response expression, H.

The error prediction value, e1, can be expressed as follows:

$$e_1(n) = \sum_{k=1}^{N} a_k e_1(n-k) + \sum_{k=1}^{N} b_k e(n-k) \quad (1)$$

where n is a time index and N is a number of taps in numerator or denominator of the IIR (infinite impulse response) predictive filter. It is noted that $a_k$ and $b_k$ represent the coefficients of the denominator, A, and numerator, B, of the filter response, respectively.

It can be shown that an error prediction value, e1, can be expressed for the next clock cycle as follows:

$$e_1(n+1) = (a_1 + b_1)e_1(n) + \sum_{k=2}^{N} (a_k + b_k)e_1(n-k) + \quad (2)$$

$$b_1 q(n) + \sum_{k=2}^{N} b_k q(n-k) - \sum_{k=1}^{N} b_k r(n+1-k)$$

Figure 4:
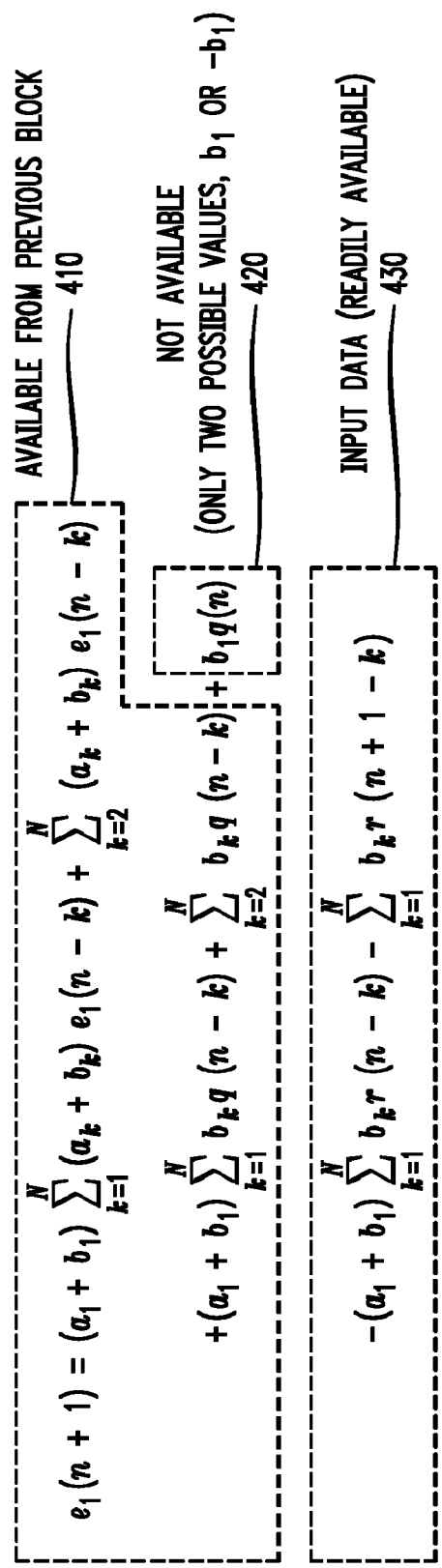
FIG. 4 illustrates the computation of the error prediction value, when the quantizer has two possible output values, using the look-ahead computation techniques of the present invention.

FIG. 4 illustrates the computation of the error prediction value, e1, when the quantizer 110 has two possible output values, using the look-ahead computation techniques of the present invention. As shown in FIG. 4, the error prediction value, e1, may be computed for a block of two input values (n and n+1) by combining a first part 410 that is available from the previous block, a second part 420 that is not available, but may be speculatively computed as there are only two possible values (b1 or −b1) and a third part 430 that is readily available from the input data. As discussed further below in conjunction with FIG. 6, the correct value from among the speculatively computed error prediction values may be selected once certain previous quantized values are computed.

In addition, for the case of two possible quantized values, the quantized output can be expressed as a function of the input values and the error prediction values, as follows:

$$q(n+1) = Q(r(n+1) - e_1(n+1)) \quad (3)$$

Figure 5:
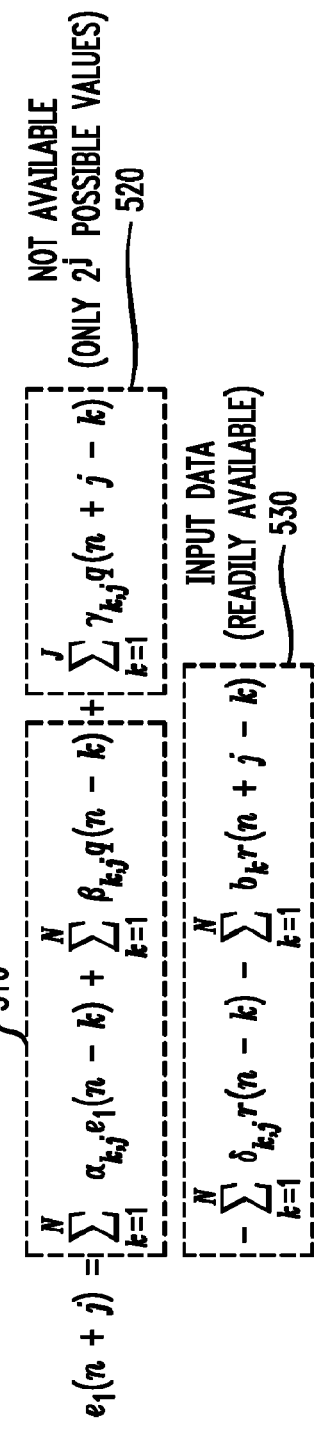
FIG. 5 illustrates the computation of the error prediction value, for a block of size J, using the look-ahead computation techniques of the present invention.

FIG. 5 illustrates the computation of the error prediction value, e1, for a block of size J, using the look-ahead computation techniques of the present invention. In the exemplary embodiment of FIG. 5, J is equal to 3 and a one bit quantizer is employed. It is noted, however, that the invention is not restricted to these values, as apparent to a person of ordinary skill in the art. As shown in FIG. 5, the error prediction value, e1, may be computed by combining a first part 510 that is available from the previous block, a second part 520 that is not available, but may be precomputed as there are only $2^J$ possible values and a third part 530 that is readily available from the input data. All $2^J$ possible values of e1(n+j) are computed in parallel and the correct result is selected (for example, using a multiplexer) when e1(n+j−1) is available. It is noted that the equation shown in FIG. 5 is derived from equation (2) and has coefficients α, β, γ and δ that may be pre-computed, as would be apparent to a person of ordinary skill in the art.

In addition, the quantized output can be expressed as a function of the input values and the error prediction values, as follows:

$$q(n+j) = Q(r(n+j) - e_1(n+j)) \quad (4)$$

Figure 6:
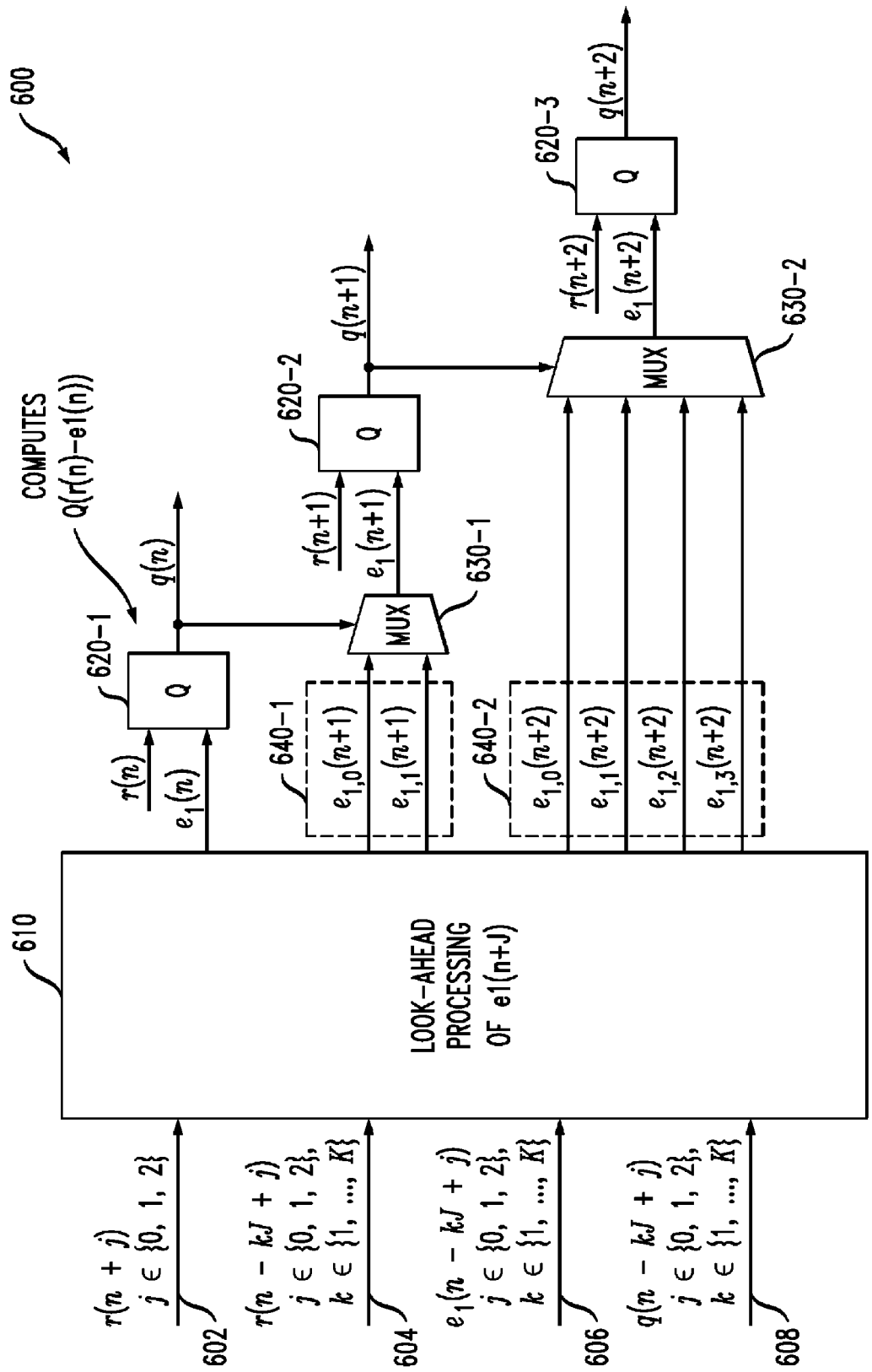
FIG. 6 illustrates an exemplary delta-sigma modulator 600 incorporating features of the present invention.

FIG. 6 illustrates an exemplary delta-sigma modulator 600 incorporating features of the present invention. The exemplary delta-sigma modulator 600 employs look-ahead/speculative techniques to process a block of inputs in parallel. The exemplary delta-sigma modulator 600 is illustrated for J equal to 3 and a two level quantizer.

As shown in FIG. 6, the exemplary delta-sigma modulator 600 comprises a look-ahead processing block 610 that implements the error prediction value equation of FIG. 4 or FIG. 5. The inputs to the look-ahead processing block 610 comprise a current block 602 of input values; one or more previous blocks of input values 604; error prediction values 606 from one or more previous blocks; and quantized values 608 of one or more previous blocks.

In addition, the exemplary delta-sigma modulator 600 comprises J quantizers 620-1 through 620-J. Each quantizer 620-1 through 620-J implements equation 3 or equation 4 to compute the quantized output, q(n+j).

It is noted that for J equal to 0, no speculation is required as the inputs to quantizer 620-1 are readily available. It is noted that for J equal to 1 and 2 speculative error prediction values 640-1 and 640-2 are computed for the possible quantizer output values. For example, for J equal to 1, $e_{1,0}(n+1)$ and $e_{1,1}(n+1)$ are speculatively computed and applied to multiplexer 630-1. The multiplexer 630-1 selects one of the speculative error prediction values based on the quantized value, $q_1(n)$, from quantizer 620-1, once it is available.

Likewise, for J equal to 2, $e_{1,0}(n+2)$, $e_{1,1}(n+2)$, $e_{1,2}(n+2)$ and $e_{1,3}(n+2)$ are speculatively computed and applied to multiplexer 630-2. The multiplexer 630-2 selects one of the speculative error prediction values based on the quantized value, $q_1(n+1)$, from quantizer to 620-2, once it is available.

It is noted that for a one bit quantizer 620, then the operation of Q(r(n)−e1(n)) could be implemented as a compare operation (comparing r(n) to e1(n) and if r(n) is greater than e1(n) then the quantizer output is 1, otherwise, the quantizer output is 0).

CONCLUSION

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method for quantizing an input signal using a predictive delta-sigma modulator, comprising:

generating error prediction values for a current block of input values based on a linear combination of error prediction values from one or more previous blocks, input values of one or more previous blocks, quantized values of one or more previous blocks and said current block of input values;

computing speculative error prediction values for at least one input value in said current block, wherein said speculative error prediction values are computed for a plurality of possible quantizer output values;

selecting one of said speculative error prediction values based on a quantized value from said current block; and subtracting said error prediction values for said current block from said corresponding current block of input values.

2. The method of claim 1, wherein one or more coefficients of said linear combination are precomputed.

3. The method of claim 1, wherein said subtracting step further comprises the computation of:

$$q(n+j)=Q(r(n+j)-e_1(n+j)).$$

4. The method of claim 1, wherein said linear combination is expressed as follows:

$$e_1(n+j) = \sum_{k=1}^{N} \alpha_{k,j} e_1(n-k) + \sum_{k=1}^{N} \beta_{k,j} q(n-k) + \sum_{k=1}^{J} \gamma_{k,j} q(n+j-k) - \sum_{k=1}^{N} \delta_{k,j} r(n-k) - \sum_{k=1}^{N} b_k r(n+j-k)$$

wherein α, β, γ and δ are precomputed coefficient values based on coefficients a and b, where a and b are coefficients of an error predictive filter.

5. The method of claim 1, wherein said input signal has a rate of $F_{clk}$ and wherein said steps of generating, computing, selecting and subtracting operate at a rate of $F_{clk}/J$.

6. The method of claim 1, wherein said subtracting operation is performed by a one bit quantizer that compares said error prediction values for said current block to said corresponding current block of input values.

7. A predictive delta-sigma modulator for quantizing an input signal, comprising:

a look-ahead processing block for generating error prediction values for a current block of input values based on a linear combination of error prediction values from one or more previous blocks, input values of one or more previous blocks, quantized values of one or more previous blocks and said current block of input values, wherein said look-ahead processing block computes speculative error prediction values for at least one input value in said current block, wherein said speculative error prediction values are computed for a plurality of possible quantizer output values;

at least one multiplexer for selecting one of said speculative error prediction values based on a quantized value from said current block; and at least one quantizer for subtracting said error prediction values for said current block from said corresponding current block of input values.

8. The predictive delta-sigma modulator of claim 7, wherein one or more coefficients of said linear combination are precomputed.

9. The predictive delta-sigma modulator of claim 7, wherein said at least one quantizer implements the computation of:

$$q(n+j)=Q(r(n+j)-e_1(n+j)).$$

10. The predictive delta-sigma modulator of claim 7, wherein said linear combination is expressed as follows:

$$e_1(n+j) = \sum_{k=1}^{N} \alpha_{k,j} e_1(n-k) + \sum_{k=1}^{N} \beta_{k,j} q(n-k) + \sum_{k=1}^{J} \gamma_{k,j} q(n+j-k) - \sum_{k=1}^{N} \delta_{k,j} r(n-k) - \sum_{k=1}^{N} b_k r(n+j-k)$$

wherein $\alpha$, $\beta$, $\gamma$ and $\delta$ are precomputed coefficient values based on coefficients a and b, where a and b are coefficients of an error predictive filter.

11. The predictive delta-sigma modulator of claim 7, wherein said input signal has a rate of $F_{clk}$ and wherein said look-ahead processing block, said at least one multiplexer and said at least one quantizer operate at a rate of $F_{clk}/J$.

12. The predictive delta-sigma modulator of claim 7, wherein said at least one quantizer is a one bit quantizer that compares said error prediction values for said current block to said corresponding current block of input values.

13. An integrated circuit, comprising:
a predictive delta-sigma modulator for quantizing an input signal, comprising:
a look-ahead processing block for generating error prediction values for a current block of input values based on a linear combination of error prediction values from one or more previous blocks, input values of one or more previous blocks, quantized values of one or more previous blocks and said current block of input values, wherein said look-ahead processing block computes speculative error prediction values for at least one input value in said current block, wherein said speculative error prediction values are computed for a plurality of possible quantizer output values;
at least one multiplexer for selecting one of said speculative error prediction values based on a quantized value from said current block; and
at least one quantizer for subtracting said error prediction values for said current block from said corresponding current block of input values.

14. The integrated circuit of claim 13, wherein one or more coefficients of said linear combination are precomputed.

15. The integrated circuit of claim 13, wherein said at least one quantizer implements the computation of:

$$q(n+j)=Q(r(n+j)-e_1(n+j)).$$

16. The integrated circuit of claim 13, wherein said linear combination is expressed as follows:

$$e_1(n+j) = \sum_{k=1}^{N} \alpha_{k,j} e_1(n-k) + \sum_{k=1}^{N} \beta_{k,j} q(n-k) + \sum_{k=1}^{J} \gamma_{k,j} q(n+j-k) - \sum_{k=1}^{N} \delta_{k,j} r(n-k) - \sum_{k=1}^{N} b_k r(n+j-k)$$

wherein $\alpha$, $\beta$, $\gamma$ and $\delta$ are precomputed coefficient values based on coefficients a and b, where a and b are coefficients of an error predictive filter.

17. The integrated circuit of claim 13, wherein said input signal has a rate of $F_{clk}$ and wherein said look-ahead processing block, said at least one multiplexer and said at least one quantizer operate at a rate of $F_{clk}/J$.

18. The integrated circuit of claim 13, wherein said at least one quantizer is a one bit quantizer that compares said error prediction values for said current block to said corresponding current block of input values.

* * * * *